(12) United States Patent
Sun et al.

(10) Patent No.: US 9,859,231 B2
(45) Date of Patent: Jan. 2, 2018

(54) RADIO FREQUENCY INTEGRATED CIRCUIT MODULE

(71) Applicant: Skyworks Solutions, Inc., Woburn, MA (US)

(72) Inventors: Weimin Sun, Santa Rosa Valley, CA (US); Peter J. Zampardi, Jr., Newbury Park, CA (US); Hongxiao Shao, Thousand Oaks, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/269,044

(22) Filed: Sep. 19, 2016

(65) Prior Publication Data

US 2017/0069584 A1 Mar. 9, 2017

Related U.S. Application Data

(60) Continuation of application No. 14/525,632, filed on Oct. 28, 2014, now Pat. No. 9,472,514, which is a
(Continued)

(51) Int. Cl.
*H05K 1/11* (2006.01)
*H01L 23/66* (2006.01)
(Continued)

(52) U.S. Cl.
CPC .............. *H01L 23/66* (2013.01); *C25D 5/022* (2013.01); *C25D 5/12* (2013.01); *C25D 7/0607* (2013.01);
(Continued)

(58) Field of Classification Search
CPC ........ H05K 1/0243; H05K 1/09; H05K 1/111; H05K 2203/049; H05K 2203/0597; H05K 3/10; H05K 3/244; H05K 3/3452
See application file for complete search history.

(56) References Cited

U.S. PATENT DOCUMENTS 5,049,979 A    9/1991  Hashemi et al.
5,249,728 A *  10/1993 Lam ..................... H01L 24/03
                                                 228/111
(Continued)

FOREIGN PATENT DOCUMENTS

EP        1087648        3/2001
JP     H09213730 A      8/1997
(Continued)

OTHER PUBLICATIONS

International Search Report dated Nov. 16, 2012 in connection with related PCT Application No. PCT/US2012/027130 (WO 2012/118896).
(Continued)

*Primary Examiner* — Yuriy Semenenko
(74) *Attorney, Agent, or Firm* — Knobbe, Martens, Olson & Bear, LLP

(57) ABSTRACT

To reduce radio frequency losses during operation of a radio frequency integrated circuit module, the radio frequency integrated circuit module is fabricated such that at least one of an edge of the wirebond pad on the copper trace and a sidewall of the copper trace is free from high-resistivity plating material. The unplated portion provides a path for the radio frequency current to flow around the high-resistivity material.

20 Claims, 6 Drawing Sheets

Related U.S. Application Data division of application No. 13/040,127, filed on Mar. 3, 2011, now Pat. No. 8,889,995.

(51) Int. Cl.

| | | |
|---|---|---|
| *C25D 5/02* | (2006.01) | |
| *C25D 5/12* | (2006.01) | |
| *H05K 1/02* | (2006.01) | |
| *H05K 3/34* | (2006.01) | |
| *C25D 7/06* | (2006.01) | |
| *H01L 23/00* | (2006.01) | |
| *H01L 23/498* | (2006.01) | |
| *H05K 1/09* | (2006.01) | |
| *H05K 3/10* | (2006.01) | |
| *C25D 17/00* | (2006.01) | |
| *H05K 3/24* | (2006.01) | |

(52) U.S. Cl.
CPC .. *H01L 23/49838* (2013.01); *H01L 23/49866* (2013.01); *H01L 24/03* (2013.01); *H01L 24/48* (2013.01); *H01L 24/49* (2013.01); *H01L 24/85* (2013.01); *H05K 1/0243* (2013.01); *H05K 1/09* (2013.01); *H05K 1/111* (2013.01); *H05K 3/10* (2013.01); *H05K 3/3452* (2013.01); *C25D 17/00* (2013.01); *H01L 24/45* (2013.01); *H01L 2223/6605* (2013.01); *H01L 2223/6611* (2013.01); *H01L 2224/03424* (2013.01); *H01L 2224/03462* (2013.01); *H01L 2224/03464* (2013.01); *H01L 2224/04042* (2013.01); *H01L 2224/05144* (2013.01); *H01L 2224/05147* (2013.01); *H01L 2224/05155* (2013.01); *H01L 2224/05164* (2013.01); *H01L 2224/45144* (2013.01); *H01L 2224/45147* (2013.01); *H01L 2224/48095* (2013.01); *H01L 2224/48229* (2013.01); *H01L 2224/48644* (2013.01); *H01L 2224/48655* (2013.01); *H01L 2224/48664* (2013.01); *H01L 2224/49111* (2013.01); *H01L 2224/85205* (2013.01); *H01L 2224/85411* (2013.01); *H01L 2224/85416* (2013.01); *H01L 2224/85444* (2013.01); *H01L 2224/85447* (2013.01); *H01L 2224/85455* (2013.01); *H01L 2224/85464* (2013.01); *H01L 2924/00011* (2013.01); *H01L 2924/00014* (2013.01); *H01L 2924/014* (2013.01); *H01L 2924/01005* (2013.01); *H01L 2924/01028* (2013.01); *H01L 2924/01029* (2013.01); *H01L 2924/01046* (2013.01); *H01L 2924/01079* (2013.01); *H01L 2924/14* (2013.01); *H01L 2924/1421* (2013.01); *H01L 2924/15747* (2013.01); *H01L 2924/2064* (2013.01); *H05K 3/244* (2013.01); *H05K 2203/049* (2013.01); *H05K 2203/0597* (2013.01)

(56) References Cited

U.S. PATENT DOCUMENTS

| | | | |
|---|---|---|---|
| 6,593,658 | B2 | 7/2003 | Huang et al. |
| 6,759,597 | B1 | 7/2004 | Cutting et al. |
| 6,798,050 | B1 | 9/2004 | Homma et al. |
| 6,930,334 | B2 | 8/2005 | Suzuki et al. |
| 6,974,776 | B2 * | 12/2005 | Dean .................. C23C 18/1651 205/201 |
| 7,473,628 | B2 * | 1/2009 | Seto ...................... H01L 24/11 257/E21.508 |
| 7,880,275 | B2 | 2/2011 | Pagaila et al. |
| 7,911,803 | B2 * | 3/2011 | Daubenspeck ... H01L 23/49838 174/261 |
| 8,021,918 | B2 | 9/2011 | Lin |
| 8,134,228 | B2 | 3/2012 | Komatsu et al. |
| 8,227,892 | B2 | 7/2012 | Chang |
| 8,456,856 | B2 | 6/2013 | Lin |
| 8,686,537 | B2 | 4/2014 | Sun et al. |
| 8,896,091 | B2 | 11/2014 | Sun et al. |
| 2003/0157792 | A1 * | 8/2003 | Tong ...................... H01L 24/11 438/614 |
| 2003/0160307 | A1 | 8/2003 | Gibson et al. |
| 2005/0104207 | A1 | 5/2005 | Dean et al. |
| 2006/0255102 | A1 | 11/2006 | Snyder et al. |
| 2007/0176287 | A1 * | 8/2007 | Crowley ............. H01L 23/3121 257/728 |
| 2008/0080112 | A1 | 4/2008 | Lin et al. |
| 2008/0206927 | A1 | 8/2008 | Graydon et al. |
| 2008/0264681 | A1 | 10/2008 | Iwai |
| 2008/0315356 | A1 | 12/2008 | Reisner |
| 2009/0051036 | A1 | 2/2009 | Abbott |
| 2009/0209064 | A1 | 8/2009 | Nonahasitthichai et al. |
| 2011/0006415 | A1 | 1/2011 | Bachman et al. |
| 2015/0061092 | A1 | 3/2015 | Sun et al. |

FOREIGN PATENT DOCUMENTS

| | | |
|---|---|---|
| JP | 2007012716 A | 1/2007 |
| JP | 2009228021 A | 10/2009 |
| JP | 2010171037 A | 8/2010 |
| WO | WO2008093626 A1 | 8/2008 |

OTHER PUBLICATIONS

Lack of Unity of Invention Sheet B for Application No. EP 12752146, 1 page.

Supplementary Partial European Search Report for Application No. 12752146.6, PCT/US2012027130 dated Nov. 24, 2014, 5 pages.

European Search Report for Application No. EP 12752146, dated Mar. 20, 2015, 7 pages.

Search Report for ROC (Taiwan) Patent Application No. 1 011 07224, dated Apr. 23, 2015, 1 page.

\* cited by examiner

RADIO FREQUENCY INTEGRATED CIRCUIT MODULE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

The present disclosure generally relates to the field of integrated circuit packaging, and more particularly to systems and methods of forming wire bond pads for packaging Radio Frequency (RF) integrated circuits (ICs).

Field

The present disclosure generally relates to the field of integrated circuit packaging, and more particularly to systems and methods of forming wire bond pads for packaging Radio Frequency (RF) integrated circuits (ICs).

Description of the Related Art

Silicon or other semiconductor wafers are fabricated into integrated circuits (ICs) as is known to one of ordinary skill in the art of IC fabrication. An IC is bonded and electrically connected to a carrier or substrate, which has layers of dielectric and metal traces, and packaged for use. A surface plating material is plated onto the top layer of copper traces to provide electrical connection points between the IC and the substrate, permitting the IC to interface with the outside world. Traditionally, nickel/gold (Ni/Au) has been a standard surface plating material for RFIC products and in certain situations, the RFIC is wire-bonded to the Ni/Au wire-bond pads plated on the surface of the substrate to form the electrical connections of the RFIC with its package. However, increases in gold prices have increased packaging costs associated with the Ni/Au surface plating.

SUMMARY

Systems and methods are disclosed to reduce the cost of RFIC packaging by using a Nickel/Palladium/Gold (Ni/Pd/Au) surface plating material for RFIC products. To decrease the costs, the gold layer in the Ni/Pd/Au surface plating is thinner than the gold layer in Ni/Au surface plating. However, Ni/Pd/Au has a much higher radio frequency sheet resistance than Ni/Au due to thin palladium and gold layers and the ferromagnetic nature of nickel. This contributes to reduced effective current sheet thickness and increased current crowding on the RF signals, and can, in some embodiments, lead to greater RF losses for RF signals traveling through the Ni/Pd/Au plated surfaces than are found on RF signals traveling through the Ni/Au plated surfaces. These losses can impact product performance and yield.

Further systems and methods are disclosed to reduce the RF losses associated with the lower cost Ni/Pd/Au surface plating for RFICs. In some embodiments of design layouts, the RF line/trace surface, edge, and sidewalls in the wire-bonding area are open to the plating process and are therefore plated with the Ni/Pd/Au surface finish. Due to the skin effect and eddy current effect on the RF current traveling through the plated wire-bonding areas, a majority of the RF current is running on the trace edges and sidewalls of the plated wire-bonding areas. Because a majority of the RF current is running on the trace edges and sidewalls, plating the trace edges and sidewalls contributes more to RF losses. To reduce the RF losses, some embodiments reconfigure the solder mask to cover the trace edges and sidewalls in the wire-bonding area such that the trace edges and sidewalls are not plated with the Ni/Pd/Au surface finish. The copper trace edges and sidewalls free from the Ni/Pd/Au plating around the wire-bonding areas provide a low resistive path for the RF current around the Ni/Pd/Au wire bond pad and thus, reduce the RF signal loss associated with the Ni/Pd/Au surface plating of the RFIC substrate.

Certain embodiments relate to a method of fabricating a radio frequency integrated circuit (RFIC) module including providing a substrate having at least one copper trace, the copper trace having a wire bonding surface. The method further includes forming a solder mask opening for a wire bonding pad directly over the bonding surface of the copper trace, the wire bonding pad having at least one edge and at least one sidewall. The method further includes forming solder mask directly over the at least one edge and the at least one sidewall of the wire bonding pad, plating the copper trace with a nickel layer, plating the nickel layer with a palladium layer and plating the palladium layer with a gold layer to form a nickel/palladium/gold wire bonding pad. The nickel/palladium/gold wire bonding pad has the at least one edge and the at least one sidewall free from the nickel, palladium, and gold layers.

According to a number of embodiments, the disclosure relates to a wire bonding pad for a radio frequency integrated circuit (RFIC) module. The wire bonding pad includes a nickel layer plated over a wire bonding surface of a copper trace, the copper trace formed on an upper surface of a substrate of an RFIC module. The wire bonding pad further includes a palladium layer plated over the nickel layer and a gold layer plated over the palladium layer. The wire bonding pad having a wire bond area, at least one edge adjacent to the wire bond area, and at least one sidewall adjacent to the at least one edge, the at least one edge and the at least one sidewall free from the nickel layer, the palladium layer, and the gold layer.

In accordance with various embodiments, an apparatus for fabricating a radio frequency integrated circuit (RFIC) module includes means for providing a substrate having at least one copper trace, the copper trace having a wire bonding surface, and means for forming a solder mask opening for a wire bonding pad directly over the bonding surface of the copper trace, the wire bonding pad having at least one edge and at least one sidewall. The apparatus further includes means for forming solder mask directly over the at least one edge and the at least one sidewall of the wire bonding pad, means for plating the copper trace with a nickel layer, means for plating the nickel layer with a palladium layer, and means for plating the palladium layer with a gold layer to form a nickel/palladium/gold wire bonding pad. The nickel/palladium/gold wire bonding pad has the at least one edge and the at least one sidewall free from the nickel, palladium, and gold layers.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the inventions and not to limit the scope of the disclosure.

Wire bonding is a technique for connecting electrical circuit devices, for example, integrated circuit (IC) die, to the next level of packaging. These circuit devices generally comprise a plurality of small conductive leads/pads that are electrically connected, for example, by ball bonding, wedge bonding, or the like, to wire bond pads on conductors embedded in the device package or substrate. The wire bond pads on the substrate provide the electrical connections between the IC and the substrate, permitting the IC to interface with the outside world. In either type of wire bonding, the wire is attached at both ends using some combination of heat, pressure, and ultrasonic energy to make a weld.

A plurality of copper patterns is formed on a substrate which is electrically connected to the circuit patterns, and a filler, such as a dielectric, is filled between the copper patterns such that an upper surface of the copper pattern is exposed. However, bare copper is not readily solderable or bondable and requires plating with a material that facilitates soldering or bonding. Areas that should not be solderable/bondable are covered with a material to resist plating. In general, solder resist refers to a polymer coating that acts as a mask and prevents the plating material from adhering to the masked copper traces. A surface plating material is plated onto the top layer of exposed copper traces to provide the wire bond pads. In some applications, wire bond pads are suited for wire bonding directly over active circuits to avoid damaging fragile devices and to lower metal resistance for power integrated circuits.

Figure 1:
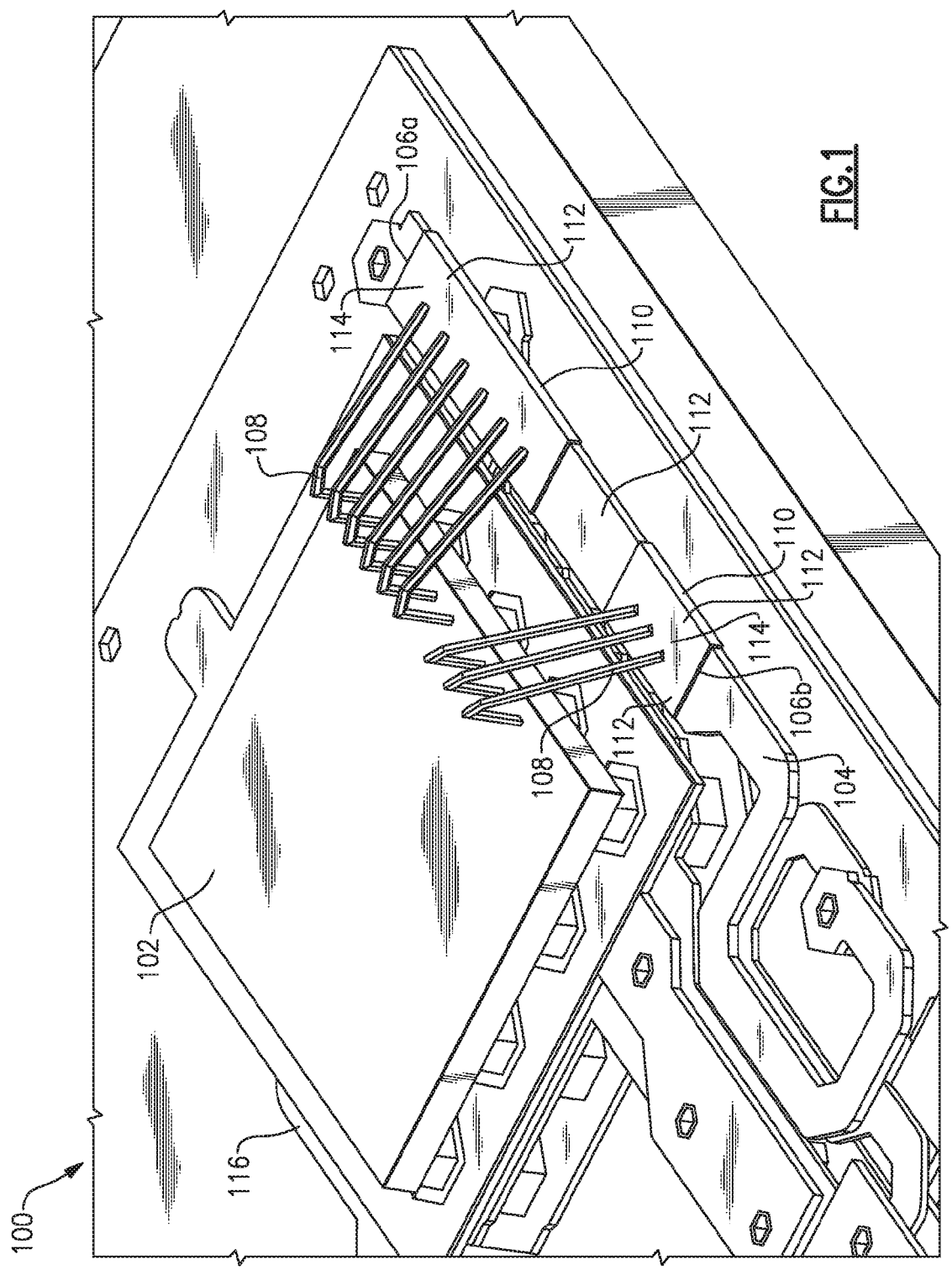
FIG. 1 illustrates an enlarged portion of an exemplary IC module comprising a wire bond pad, according to certain embodiments.

FIG. 1 illustrates a portion of an IC module 100 comprising an IC 102, a substrate 116, a copper trace 104, wire bond pads 106a, 106b, and bonding wires 108, according to an embodiment. The IC is wire bonded to wire bond pads 106 through wires 108. In the illustrated embodiment, wire bond pad 106a is a 6-wire wire bond pad and wire bond pad 106b is a 3-wire wire bond pad. In other embodiment, other numbers of wires 108 can be attached to the wire-bond pads 106. Wire bond pad 106 comprises a bond area 114, sidewalls 110, and edges 112.

Figure 2:
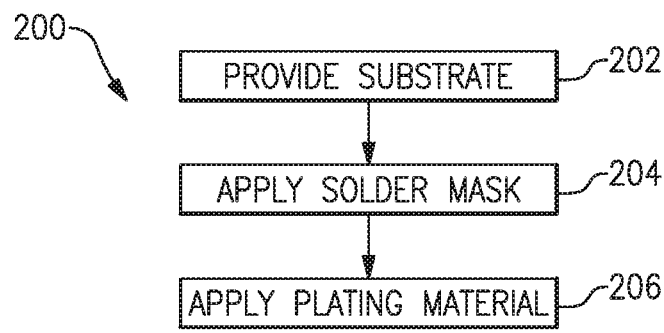
FIG. 2 illustrates a flow chart for an exemplary process for forming wire bond pads.

FIG. 2 illustrates a flow chart for an exemplary process 200 for forming wire bond pads. The process 200 is described with respect to the embodiment illustrated in FIG. 1. State 202 begins with a substrate 116 formed with layers of dielectrics and conductors 104, including a trace 104 on an upper surface of the substrate 116, to form circuit paths as is known to one of ordinary skill in the art of semiconductor fabrication.

At State 204, the process 200 applies solder mask to those areas of the IC module 100 that are to be kept free of plating material, as is known to one of ordinary skill in the art of semiconductor fabrication. A solder mask opening defines the areas to which the plating material will adhere. In some embodiments, the solder mask opening exposes the wire bond area 114, the sidewalls 110, and the edges 112 of the wire bond pad 106 to the plating material. In other embodiments, the trace 104 and the wire bond area 114, the sidewalls 110, and the edges 112 of the wire bond pad 106 are open to the plating process.

At State 206, the exposed areas (free of solder mask) of the copper trace 104 are plated with the plating material to form the wire bond pads 106 as is known to one of ordinary skill in the art of semiconductor fabrication.

In an embodiment, the plating material is nickel/gold (Ni/Au). At State 206, the nickel layer is plated over the copper trace 104 and the gold layer is plated over the nickel layer. Examples of plating techniques include, for example, immersion plating deposition, electrolytic plating, electroless plating, and the like.

In an embodiment, the copper trace is between about 5 microns and about 50 microns thick, and preferably approximately 20 microns. The nickel layer in the Ni/Au plating is between about 2.5 microns to about 7.6 microns thick, and more preferably, between about 5 microns to about 7 microns. The gold layer is approximately 0.70+/−0.2 microns thick, and more preferably approximately 0.5+/−0.1 microns.

Traditionally, Ni/Au has been a standard surface plating material for radio frequency integrated circuit (RFIC) products. Radio frequency (RF) is a rate of oscillation in the range of about 30 kHz to about 300 GHz. In an embodiment, the RFIC 102 is wire-bonded to Ni/Au wire-bond pads 106 plated on the surface of the substrate 116 to form the electrical connections of the RFIC 102 with its package. However, increases in gold prices have increased packaging costs associated with the Ni/Au surface plating.

To reduce packaging costs, a nickel/palladium/gold (Ni/Pd/Au) plating material is used to form wire bond pads for RFICs. In an embodiment, the RFIC 102 is wire-bonded to Ni/Pd/Au wire-bond pads 106 plated on the surface of the substrate 116 to form the electrical connections of the RFIC 102 with its package. The Ni/Pd/Au plating uses less gold than the Ni/Au plating material, and, as gold prices increase, the Ni/Pd/Au plating is advantageously less costly than the Ni/Au plating material.

Figure 3:
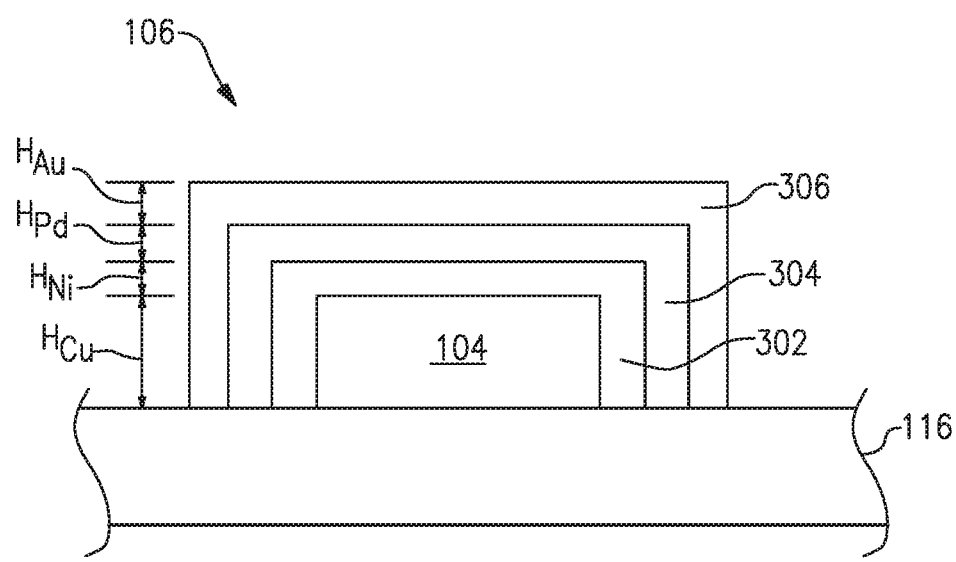
FIG. 3 illustrates a cross-section of a Ni/Pd/Au wire bond pad on the IC module of FIG. 1, according to an embodiment.

FIG. 3 illustrates a cross-section of the Ni/Pd/Au wire bond pad 106 on the surface of the substrate 116, according to an embodiment. The Ni/Pd/Au wire bond pad 106 comprises a nickel layer 302, a palladium layer 304, and a gold layer 306.

Referring to FIGS. 2 and 3, at State 206, the nickel layer 302 is plated over the copper trace 104; the palladium layer 304 is plated over the nickel layer 302, and the gold layer 306 is plated over the palladium layer 304. Examples of plating techniques include, for example, immersion plating deposition, electrolytic plating, electroless plating, and the like.

In an embodiment illustrated in FIG. 3, a height $H_{Cu}$ of the copper trace 104 is between about 5 microns and about 50 microns, and preferably 20 microns. A height $H_{Ni}$ of the nickel layer 302 is between about 2.5 microns to about 7.6 microns, and more preferably between about 5 microns to about 7 microns. A height $H_{Pd}$ of the palladium layer 304 is approximately 0.09+/−0.06 microns, and more preferably approximately 0.1+/−0.01 microns. A Height $H_{Au}$ of the gold layer 306 is approximately 0.10+/−0.05 microns, and more preferably approximately 0.1+/−0.01 microns.

However, the Ni/Pd/Au plated surface, due to the thin palladium and gold layers 304, 306 and the ferromagnetic nature of the nickel layer 302, has a higher sheet resistance at radio frequencies than the Ni/Au plated surface. Sheet resistance is applicable to two-dimensional systems where the thin film, such as surface finish plating for semiconductors, for example, is considered to be a two-dimensional entity. It is analogous to resistivity in three-dimensional systems. When the term sheet resistance is used, the current must be flowing along the plane of the sheet, not perpendicular to it.

In the Ni/Au wire bond pad embodiment described above, the sheet resistance of the Ni/Au is approximately 30 mΩ/square at 2 GHz whereas the sheet resistance of the Ni/Pd/Au in the Ni/Pd/Au wire bond pad embodiment described above and illustrated in FIG. 3 is approximately 150 mΩ/square at 2 GHz. Consequently, plating the wire bond pads 106 with the Ni/Pd/Au plating material instead the Ni/Au plating material can, in an embodiment, lead to extra RF losses. In turn, this can impact product performance and yield. In some embodiments, a Ni/Pd/Au plated surface may potentially increase RF loss by approximately 0.1 dB to approximately 0.4 dB, or equivalently impact power efficiency by approximately 1% to approximately 4%.

Further, oscillating signals are subject to skin effect. Skin effect is the tendency of an alternating electrical current to distribute itself within a conductor so that the current density near the surface of the conductor is greater than that at its core. That is, the electric current tends to flow at the skin of the conductor at an average depth called the skin depth. The skin effect causes the effective resistance of the conductor to increase with the frequency of the current because much of the conductor carries little current. Skin effect is due to eddy currents induced by the alternating current. As the frequency of the signal increases, to RF frequencies, for example, the skin depth decreases. In addition, the eddy currents also cause crowding of the alternating RF current at the edges of the conductor. Thus, a major portion of the RF current travels on the edge and sidewalls of the conductor 104.

Figure 4:
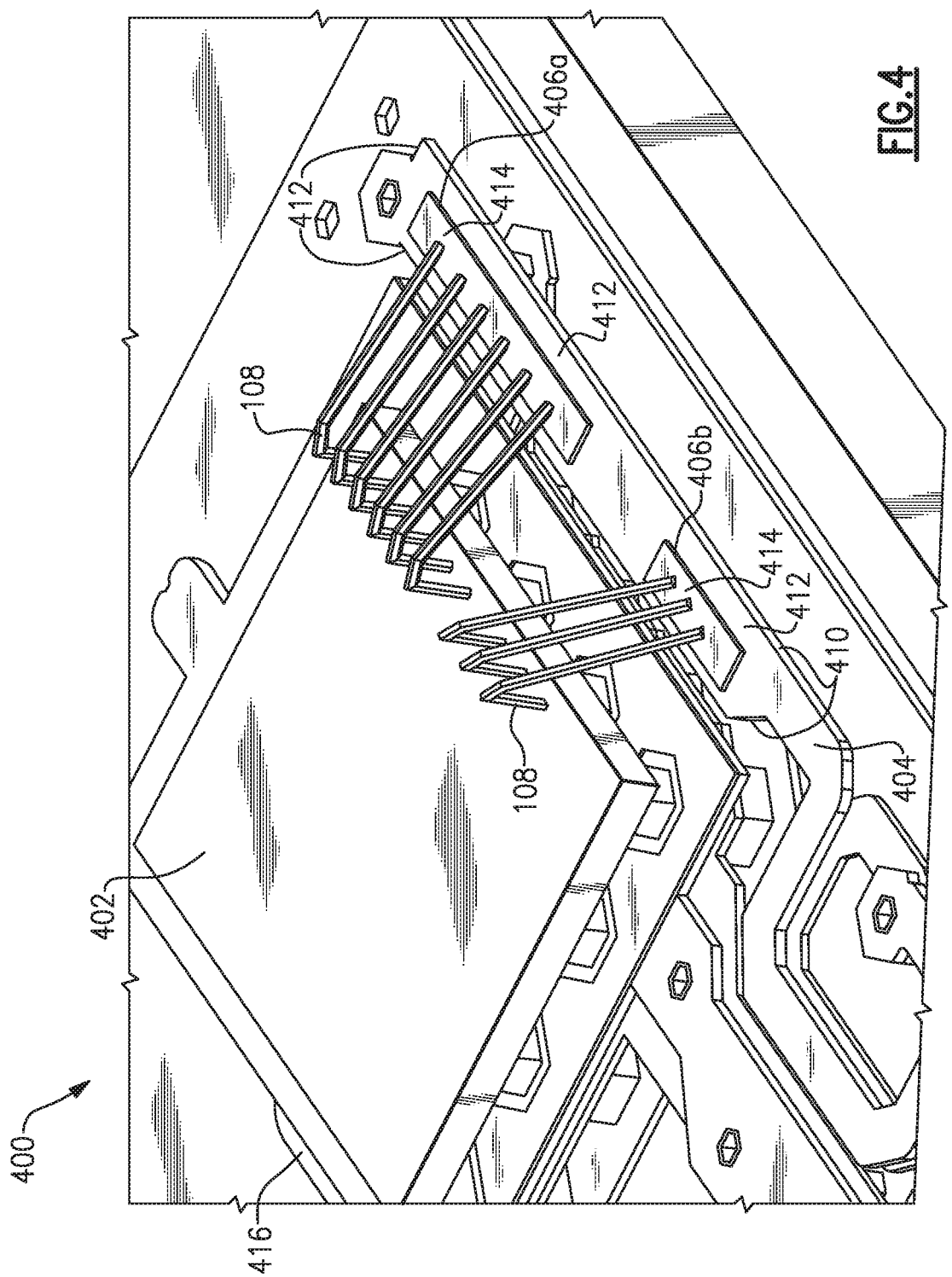
FIG. 4 illustrates an enlarged portion of an exemplary RFIC module comprising a wire bond pad, according to certain embodiments.

FIG. 4 illustrates an enlarged portion of an RFIC module 400 comprising an RFIC 402, a substrate 416, a copper trace 404, wire bond pads 406, and the bonding wires 108, according to an embodiment. The RFIC 402 is wire bonded to the wire bond pads 406 through the bonding wires 108. In the illustrated embodiment, a wire bond pad 406a is a 6-wire wire bond pad and a wire bond pad 406b is a 3-wire wire bond pad. In other embodiments, other numbers of wires 108, such as for example, 1, 2, 3, 4, 5 or more than 6, can be attached to the wire-bond pads 406. The wire bond pad 406 comprises a bond area 414, sidewalls 410, and edges 412.

To reduce RF signal losses, the fabrication process can limit the Ni/Pd/Au wire bond pad 406 to the bond area 414, leaving the sidewalls 410 and edges 412 free from the Ni/Pd/Au plating material. The majority of the RF current travels through the unplated edges and sidewalls surrounding the plated wire bond area 414, instead of traveling through the plated edge 412 and sidewalls 410 as illustrated in FIGS. 1 and 3. Thus, the RF losses are reduced.

Figure 5:
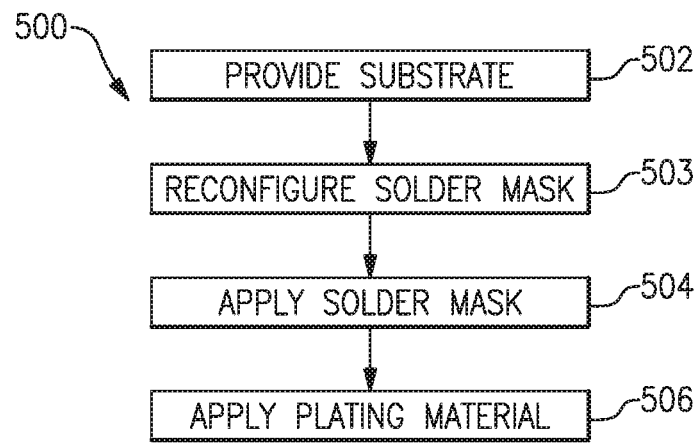
FIG. 5 illustrates a flow chart for an exemplary process for forming Ni/Pd/Au wire bond pads, according to certain embodiments.

FIG. 5 illustrates a flow chart for an exemplary process 500 for forming Ni/Pd/Au wire bond pads 406, according to an embodiment. The process 500 is described with respect to the embodiment illustrated in FIG. 4. State 502 begins with the substrate 416 formed with layers of dielectrics and conductors 404, including trace 404 on an upper surface of the substrate 416, to form circuit paths as is known to one of ordinary skill in the art of semiconductor fabrication.

At State 503, in an embodiment, the solder mask is reconfigured to cover the edges 412 and sidewalls 410 of the wire bond pads 406. In another embodiment, the solder mask is reconfigured to cover the trace 404, and the edges 412 and the sidewalls 410 of the wire bond pads 406. The solder mask opening covers the wire bond area 414, such that the wire bond area 414 is open to the plating process, while the edges 412 and the sidewalls 410 are not. In an embodiment, the width of the edge 412 covered by the solder mask should be at least wider than the solder mask opening registration tolerance. In another embodiment, the width of the edge 412 covered by the solder mask is approximately 10 microns to 200 microns, and preferably 50 microns to 100 microns.

At State 504, the process 500 applies the reconfigured solder mask to the RFIC module 400, as is known to one of ordinary skill in the art of semiconductor fabrication.

At State 506, the process 500 plates the RFIC module 400 with the Ni/Pd/Au plating material to form the wire bond pads 406 as is known to one of ordinary skill in the art of semiconductor fabrication. Examples of plating techniques include, for example, immersion plating deposition, electrolytic plating, electroless plating, and the like.

Figure 6:
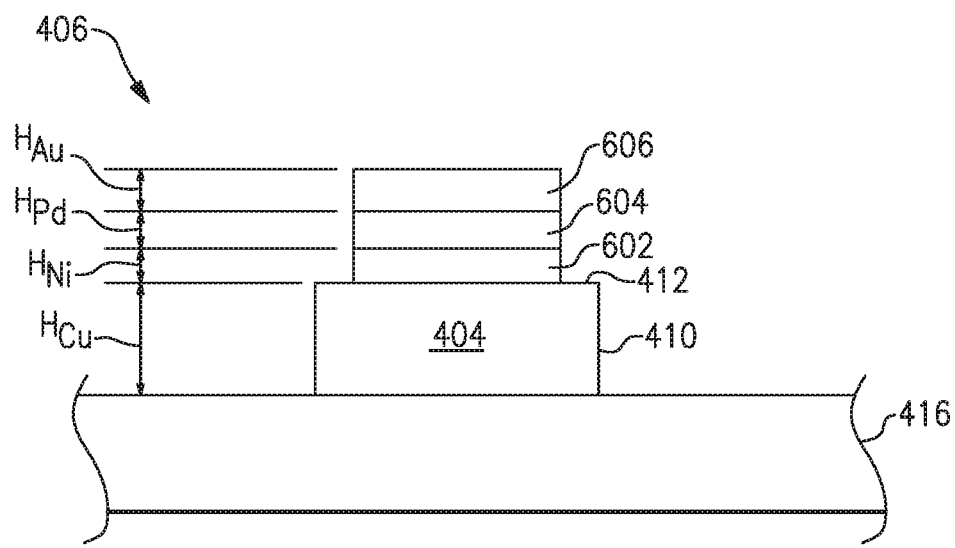
FIG. 6 illustrates a cross-section of a Ni/Pd/Au wire bond pad on the RFIC module of FIG. 4, according to an embodiment.

FIG. 6 illustrates a cross-section of the Ni/Pd/Au wire bond pad 406 on the surface of the substrate 416, according to an embodiment. The Ni/Pd/Au wire bond pad 406 comprises a nickel layer 602, a palladium layer 604, and a gold layer 606. As illustrated in FIG. 6, the edges 412 and sidewalls 410 of the Ni/Pd/Au wire bond pad 406 are free from the Ni/Pd/Au plating.

Referring to FIGS. 5 and 6, the nickel layer 602 is plated over the copper trace 404; the palladium layer 604 is plated over the nickel layer 602, and the gold layer 606 is plated over the palladium layer 604. Examples of plating techniques include, for example, immersion plating deposition, electrolytic plating, electroless plating, and the like.

In an embodiment illustrated in FIG. 6, a height $H_{Cu}$ of the copper trace 404 is between about 5 microns and about 50 microns, and preferably approximately 20 microns. A height $H_{Ni}$ of the nickel layer 602 is between about 2.5 microns to about 7.6 microns, and more preferably between about 5 microns to about 7 microns. A height $H_{pd}$ of the palladium layer 604 is approximately 0.09+/−0.06 microns, and more preferably approximately 0.1+/−0.01 microns. A height $H_{Au}$ of the gold layer 606 is approximately 0.10+/−0.05 microns, and more preferably approximately 0.1+/−0.01 microns.

Figure 7:
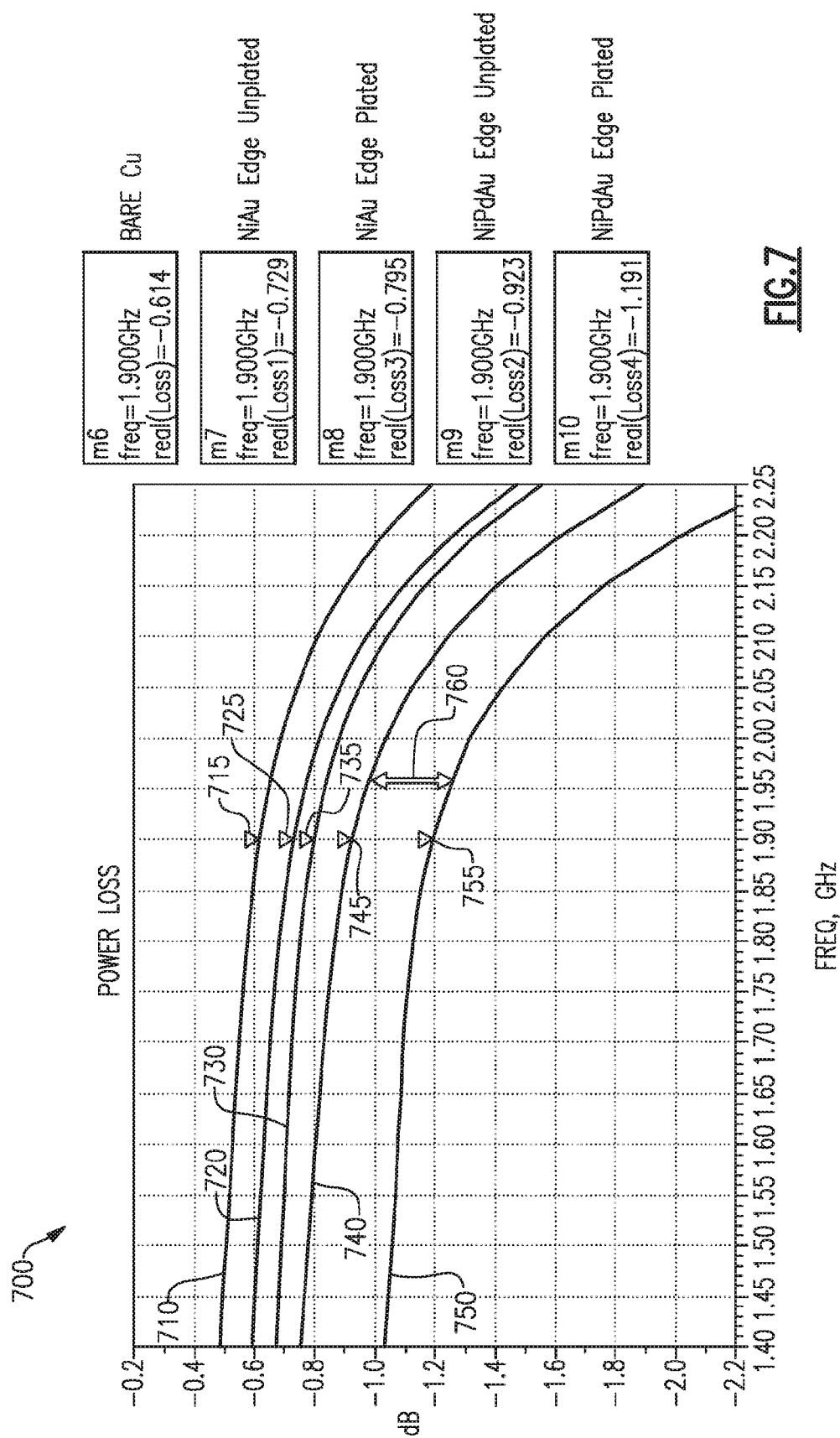
FIG. 7 is a graph comparing the RF losses for traces with edge/sidewall exposed surfaces and edge/sidewall plated surfaces, according to certain embodiments.

FIG. 7 is a graph 700 comparing the RF losses for traces with edge/sidewall exposed surfaces and edge/sidewall plated surfaces, according to an embodiment. The graph 700 shows power loss expressed in decibels (dBs) along the y or vertical axis and frequency expressed in gigahertz (GHz) along the x or horizontal axis. The power loss of the RF signals is calculated as $10 \log_{10}$[RFpowerout/RFpower in] at frequencies ranging from about 1.40 GHz to about 2.25 GHz.

The graph 700 comprises lines 710, 720, 730, 740, and 750, representing the power loss of an RF signal through various traces on an RFIC substrate. Line 710 indicates an RF power loss of the RF signal through a bare copper trace (no surface finish). At approximately 1.9 GHz, as indicated by point 715, the power loss is approximately 0.614 dB.

Line 720 indicates the power loss of the RF signal through a copper trace comprising a Ni/Au bonding pad having its edges and sidewalls free from plating, while line 730 indicates the power loss through a copper trace comprising a Ni/Au bonding pad with its edges and sidewalls plated with the Ni/Au plating material. Point 725 on line 720 indicates the power loss to be approximately 0.729 dB at approximately 1.9 GHz and point 735 on line 730 indicates the power loss to be approximately 0.795 dB at approximately 1.9 GHz.

Line 740 indicates the power loss of the RF signal through a copper trace comprising a Ni/Pd/Au bonding pad having its edges and sidewalls free from plating, while line 750 indicates the power loss through a copper trace comprising a Ni/Pd/Au bonding pad with its edges and sidewalls plated with the Ni/Pd/Au plating material. Point 745 on line 740 indicates the power loss to be approximately 0.923 dB at approximately 1.9 GHz and point 755 on line 750 indicates the power loss to be approximately 1.191 dB at approximately 1.9 GHz.

Referring to the embodiments illustrated in FIG. 7, the bare copper trace (line 710) provides the least power loss and the trace comprising the Ni/Pd/Au bonding pad having plated edges and sidewalls (line 750) provides the greatest RF power loss. Traces with Ni/Au bonding pads (lines 720, 730) create less power loss to the RF signal than traces with Ni/Pd/Au bonding pads (lines 740, 750). Comparing the traces comprising the Ni/Au bonding pad, the trace with exposed edge and sidewalls (line 720) creates less power loss than the trace with the plated edge and sidewalls (line 730). Similarly, the trace with the Ni/Pd/Au bonding pad with exposed edge and sidewalls (line 740) creates less power loss to the RF signal than the trace comprising the Ni/Pd/Au bonding pad with plated edges and sidewalls (line 750). As indicated by arrow 760, in an embodiment, the RF power loss for the RF signal passing through the Ni/Pd/Au bonding pad that does not have its edges and sidewalls plated with the Ni/Pd/Au plating material is approximately 0.26 dB less than the RF power loss of the RF signal passing through the Ni/Pd/Au bonding pad with Ni/Pd/Au plated edges and sidewalls.

In an embodiment, there is a minimum width for the plated wire bond area 414 that is exposed to the process 500 to achieve successful and reliable wire bond connections. FIGS. 4 and 6, described above, illustrate embodiments of the wire bonding pads 406 that fit within the uniform width of the copper trace 404. In other words, the width of the plated wire bond area 414 and the width of the unplated edges 412 and sidewalls 414 do not exceed the uniform width of the trace 404 in the area of the wire bond pad 406 and the areas of the trace 404 adjacent to the wire bond pad 406.

FIGS. 8A-8F illustrate exemplary layouts for wire bonding pads where the minimum width of the plated bond area 414 and the width of at least one unplated edge 412 exceed the uniform width of the trace 404 in the area of the wire bond pad 406 and the areas of the trace 404 adjacent to the wire bond pad 406. If, in an embodiment, after the edge 412 of the wire bond pad 406 is covered with solder mask such that it remains free of plating, the minimum size requirements for the wire bond area 414 are not met, the width of the trace 404 can be proportionally increased with minimal edge exposure to meet the size requirements.

FIGS. 8A-8D illustrate exemplary layouts of wire bond pads 406 having exposed edges 412 and sidewalls 410 surrounding the wire bond pads 406. In an embodiment, if, after the edge 412 of the wire bond pad 406 is covered with solder mask such that it remains free of plating, the minimum size requirements for the wire bond area 414 are not met, the width of the trace 404 can be deformed with minimal edge exposure to meet the wire bonding area 414 size requirements. In other words, a layout of the wire-bonding area meets or is larger than the minimal dimensions set by the design rule of a substrate technology, and at the same time, minimizes plated edges and sidewalls of the copper trace comprising the bonding area. Thus, the RF current flows through a minimal distance on the high resistive plated edges and sidewalls. In FIGS. 8A-8D, the trace 404 expands in width in the area of the wire bond pad 406 to accommodate the wire bond area 414. Further, the expanded trace 404 permits the wire bond pad 406 to maintain covered edges 412 and sidewalls 410 (not illustrated) during the solder mask process, which in turn permits the completed wire bond pad 406 to maintain exposed edges 412 and sidewalls 410 along all of the perimeter of the wire bond pad 406.

Figure 8A:
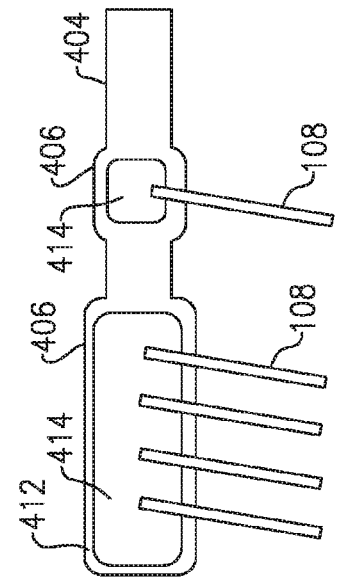
FIGS. 8A-8F illustrate exemplary layouts for wire-bonding areas having minimized edges and sidewalls exposed to plating.
Figure 8B:
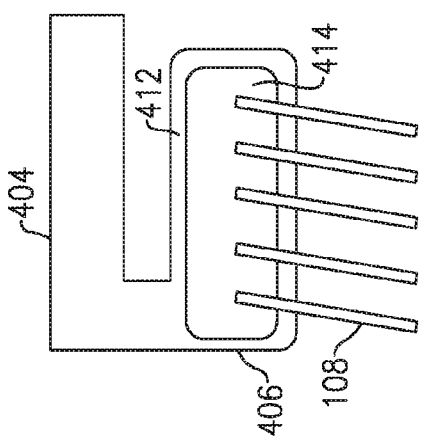
Figure 8C:
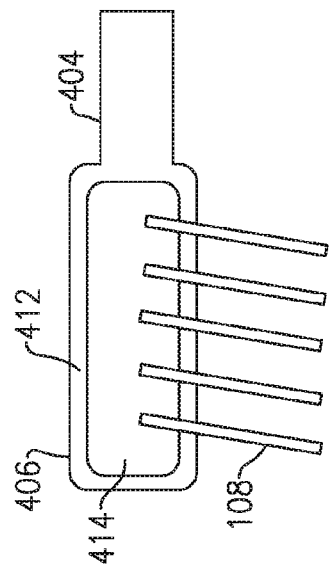
Figure 8D:
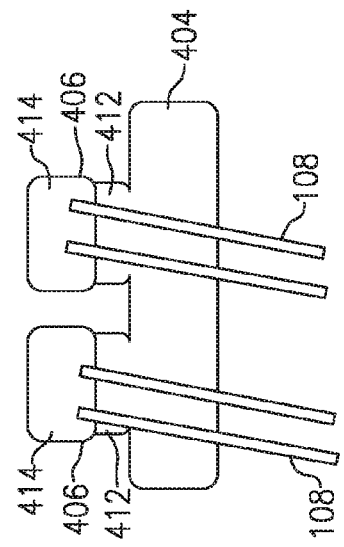
Figure 8E:
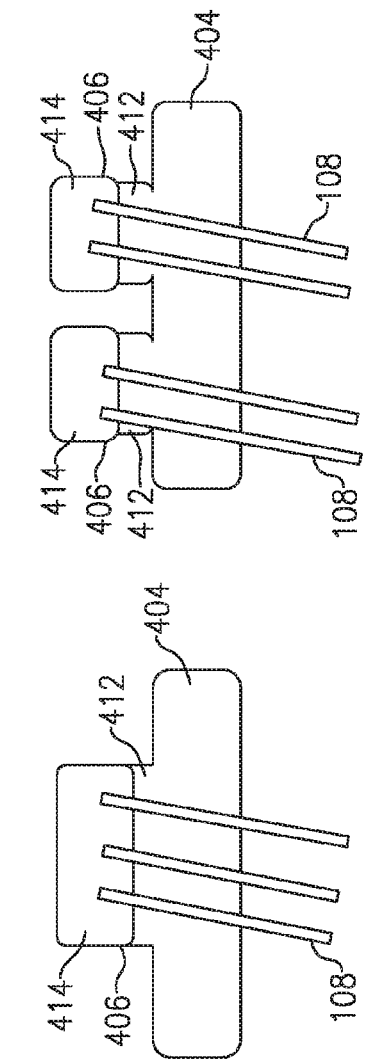
Figure 8F:
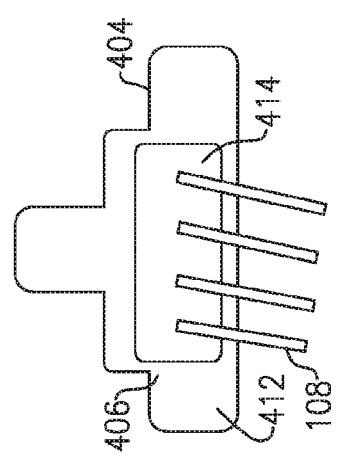

FIGS. 8E and 8F illustrate exemplary layouts where the trace 404 comprises the wire bond pad 406, but circuit layout considerations limit the pad size and prevent the edge 412 from being covered with solder mask during the masking process. In one embodiment, the trace 404 deforms with a wire bond pad 406 to accommodate the wire bond area 414. In another embodiment, the trace 404 deform in the area of the wire bond pad 406 to accommodate the wire bond area 414. In FIG. 8E, the trace 404 is deformed with one wire bond pad 406 to accommodate a 3-wire wire bonding area 414. In FIG. 8F, the trace 404 is deformed with two wire bond pads 406 to accommodate two 2-wire wire bonding areas 414. Thus, the deformed trace 404 permits a minimal length of edges and sidewalls being plated, or in other words, maximizes the length of unplated edges and sidewalls to reduce RF losses and maintains the required bondable area of the wire bond pad.

To reduce costs, in some embodiments, Ni/Pd/Au instead of Ni/Au is plated onto the surface traces of substrates for RFIC modules to form wire-bond areas. However, Ni/Pd/Au has a higher RF sheet resistance than Ni/Au and this leads to higher RF losses for signals traveling through Ni/Pd/Au wire-bond areas than for signals traveling through Ni/Au wire-bond areas. To reduce the RF losses associated with high RF loss plating, such as, for example, Ni/Pd/Au plating, the solder mask is reconfigured to prevent the edges and sidewalls of the wire-bond areas from being plated in some embodiments. Leaving the edges and sidewalls of the wire-bond areas free from high RF loss plating, such as Ni/Pd/Au plating, provides a path for the RF current to flow through low resistivity material, which reduces the RF signal loss associated with the high resistivity plating material.

While embodiments have been described with respect to Ni/Pd/Au surface plating, the disclosed systems and methods apply to any high RF loss surface plating, such as, for example, Sn, Pb, other surfaces of ferromagnetic materials, and the like.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those ordinary skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency integrated circuit module comprising:
    a substrate;
    a radio frequency integrated circuit die supported by the substrate;
    a copper trace including at least a sidewall and formed on the substrate; and
    a wire bonding pad including a nickel layer plated over a portion of the copper trace, a palladium layer plated over the nickel layer, and a gold layer plated over the palladium layer, the wire bonding pad covering a plated portion of a top surface of the copper trace, the wire bonding pad not covering the sidewall of the copper trace and not covering an unplated portion of the top surface of the copper trace that is substantially parallel to the wire bonding pad, a width of the unplated portion extending from a periphery of the wire bonding pad to the sidewall of the copper trace, a plurality of leads of the radio frequency integrated circuit die bonded to the wire bonding pad, the sidewall of the copper trace and the unplated portion of the top surface of the copper trace free from plating material to reduce radio frequency power loss from a radio frequency signal traveling from the radio frequency integrated circuit die to the wire bonding pad, and then along the copper trace to an output of the radio frequency integrated circuit module.

2. The radio frequency integrated circuit module of claim 1 wherein the width of the unplated portion of the top surface of the copper trace is at least approximately 50 microns.

3. The radio frequency integrated circuit module of claim 1 wherein the width of the unplated portion of the top surface of the copper trace is approximately 50 microns to approximately 100 microns.

4. The radio frequency integrated circuit module of claim 1 wherein the width of the unplated portion of the top surface of the copper trace is approximately 20 microns to approximately 200 microns.

5. The radio frequency integrated circuit module of claim 1 wherein the unplated portion of the copper trace forms an unplated path on the copper trace that conducts radio frequency current during operation of a radio frequency integrated circuit.

6. The radio frequency integrated circuit module of claim 5 wherein the copper trace is deformed in a wire bond area of the wire bonding pad to accommodate minimum size requirements of the wire bond area as set by design rules of a substrate technology to maintain the unplated path on the top surface of the copper trace to conduct the radio frequency current.

7. The radio frequency integrated circuit module of claim 5 wherein the copper trace is deformed in a wire bond area of the wire bonding pad to accommodate minimum size requirements of the wire bond area as set by design rules of a substrate technology to maintain the unplated path along at least the sidewall of the copper trace to conduct the radio frequency current.

8. A radio frequency device comprising:
    a substrate;
    a radio frequency integrated circuit die supported by the substrate;

a copper trace including at least a sidewall and formed on the substrate; and a wire bonding pad including plating material plated over a portion of the copper trace, the wire bonding pad covering a plated portion of a top surface of the copper trace, the wire bonding pad not covering the sidewall of the copper trace and not covering an unplated portion of the top surface of the copper trace that is substantially parallel to the wire bonding pad, a width of the unplated portion extending from a periphery of the wire bonding pad to the sidewall of the copper trace, a plurality of leads of the radio frequency integrated circuit die bonded to the wire bonding pad, the sidewall of the copper trace and the unplated portion of the top surface of the copper trace free from plating material to reduce radio frequency power loss from a radio frequency signal traveling from the radio frequency integrated circuit die to the wire bonding pad, and then along the copper trace to an output of the radio frequency device.

9. The radio frequency device of claim 8 wherein the width of the unplated portion of the top surface of the copper trace is at least approximately 50 microns.

10. The radio frequency device of claim 8 wherein the width of the unplated portion of the top surface of the copper trace is approximately 50 microns to approximately 100 microns.

11. The radio frequency device of claim 8 wherein the width of the unplated portion of the top surface of the copper trace is approximately 20 microns to approximately 200 microns.

12. The radio frequency device of claim 8 wherein the unplated portion of the copper trace forms an unplated path on the copper trace that conducts radio frequency current during operation of a radio frequency integrated circuit.

13. The radio frequency device of claim 12 wherein the copper trace is deformed in a wire bond area of the wire bonding pad to accommodate minimum size requirements of the wire bond area as set by design rules of a substrate technology to maintain the unplated path on the top surface of the copper trace to conduct the radio frequency current.

14. The radio frequency device of claim 12 wherein the copper trace is deformed in a wire bond area of the wire bonding pad to accommodate minimum size requirements of the wire bond area as set by design rules of a substrate technology to maintain the unplated path along at least the sidewall of the copper trace to conduct the radio frequency current.

15. An integrated circuit module comprising:
a substrate;
an integrated circuit die supported by the substrate;
a copper trace including at least a sidewall and formed on the substrate; and
a wire bonding pad including a nickel layer plated over a portion of a top surface of the copper trace and a gold layer plated over the nickel layer, the wire bonding pad covering a plated portion of a top surface of the copper trace, the wire bonding pad not covering the sidewall of the copper trace and not covering an unplated portion of the top surface of the copper trace that is substantially parallel to the wire bonding pad, a width of the unplated portion extending from a periphery of the wire bonding pad to the sidewall of the copper trace, a plurality of leads of the integrated circuit die bonded to the wire bonding pad, the sidewall of the copper trace and the unplated portion of the top surface of the copper trace free from plating material to reduce radio frequency power loss from a radio frequency signal traveling from the integrated circuit die to the wire bonding pad, and then along the copper trace to an output of the integrated circuit module.

16. The integrated circuit module of claim 15 wherein the width of the unplated area of the top surface of the copper trace is at least approximately 50 microns.

17. The integrated circuit module of claim 15 wherein the width of the unplated portion of the top surface of the copper trace is approximately 50 microns to approximately 100 microns.

18. The integrated circuit module of claim 15 wherein the width of the unplated portion of the top surface of the copper trace is approximately 20 microns to approximately 200 microns.

19. The integrated circuit module of claim 15 wherein the copper trace is deformed in a wire bond area of the wire bonding pad to accommodate minimum size requirements of the wire bond area as set by design rules of a substrate technology to maintain the unplated path on the top surface of the copper trace to conduct the radio frequency current.

20. The integrated circuit module of claim 15 wherein the copper trace is deformed in a wire bond area of the wire bonding pad to accommodate minimum size requirements of the wire bond area as set by design rules of a substrate technology to maintain the unplated path along at least the sidewall of the copper trace to conduct the radio frequency current.

* * * * *